United States Patent [19]

Nolan

[11] Patent Number: 4,717,847

[45] Date of Patent: Jan. 5, 1988

[54] TTL COMPATIBLE CMOS INPUT BUFFER

[75] Inventor: Joseph G. Nolan, Willow Grove, Pa.

[73] Assignee: Harris Corporation, Melbourne, Fla.

[21] Appl. No.: 728,271

[22] Filed: Apr. 29, 1985

[51] Int. Cl.$^4$ .................. H03K 19/02; H03K 19/094; H03K 17/60

[52] U.S. Cl. .................... 307/475; 307/446; 307/451; 307/469; 307/570

[58] Field of Search ............... 307/443, 446, 451, 475, 307/469, 363, 570, 585, 264, 270

[56] References Cited

U.S. PATENT DOCUMENTS

| | | | |
|---|---|---|---|
| 3,601,630 | 8/1971 | Redwine | 307/446 |
| 3,900,746 | 8/1975 | Kraft et al. | 307/475 |
| 4,185,209 | 1/1980 | Street | 307/446 |
| 4,274,014 | 6/1981 | Schade, Jr. | 307/585 |
| 4,295,065 | 10/1981 | Hsieh et al. | 307/475 |
| 4,301,383 | 11/1981 | Taylor | 307/585 |
| 4,449,065 | 5/1984 | Davis, Jr. | 307/473 |

FOREIGN PATENT DOCUMENTS

| | | | |
|---|---|---|---|
| 53-87187 | 8/1978 | Japan | 307/446 |
| 0079641 | 5/1984 | Japan | 307/446 |

Primary Examiner—John S. Heyman
Assistant Examiner—M. R. Wambach
Attorney, Agent, or Firm—Barnes & Thornburg

[57] ABSTRACT

A TTL to CMOS buffer includes first and second field effect transistors of opposite conductivity types connected to form an inverter. The main current conducting path of a third transistor is connected in series with the current conducting paths of the first and second transistors. The control terminal of the third transistor is connected to a power supply. In a preferred embodiment, a bipolar transistor is connected between the output of the inverter circuit and the buffer output. The bipolar transistor may be a common parasitic device produced in conjunction with the CMOS circuits. This transistor offers a degree of temperature compensation to the buffer circuit output.

9 Claims, 6 Drawing Figures

TTL COMPATIBLE CMOS INPUT BUFFER

BACKGROUND AND SUMMARY OF THE INVENTION

This invention relates to a TTL compatible CMOS input buffer. The invention is useful in achieving input threshold control and matching TTL threshold levels to CMOS levels.

U.S. Pat. No. 4,295,065 to Hsieh et al. discloses a TTL to CMOS input buffer, or level shift circuit, which incorporates a level shift portion comprising CMOS transistors $P_1$, $N_1$, $P_3$, and $N_3$. These devices are connected in such a manner as to reduce static power consumption by eliminating current paths between nodes 13 and 19 of, for example, the circuits shown in FIGS. 1 and 3b of 4,295,065. With further reference to these same Figures, transistors $P_1$ and $N_1$ form an inverter with transistor $N_3$ connected in series between $P_1$ and $N_1$ on the output side. When $V_{IN}$ is high, $P_1$ is OFF and $N_1$ and $N_3$ are ON, clamping node 15 and terminal 17 to ground. At the same time, $P_3$ is ON, clamping node 11 to $V_{DD}$. When $V_{IN}$ is low, $P_1$ is ON clamping node 15 to $V_{DD}$, $P_3$ is OFF due to the $V_{DD}$ potential at node 15, and $N_1$ and $N_3$ are OFF. Thus, terminal 17 is allowed to float and is isolated from both terminal 15 ($V_{DD}$) and terminal 19 (ground).

Since $N_1$ and $N_3$ act as a voltage divider when $V_{IN}$ is high, the channel resistance, $R_{ON}$, of $N_3$ is an important parameter in the design of this circuit. The equation for channel resistance of a CMOS device is $R_{ON}$=channel length/(channel width$\times k' \times 2$ ($V_{GS}-V_t$)). Thus, for devices of the same length, $R_{ON}$ is affected by variations in channel width and $V_{GS}$. The remaining variables ($k'$ and $V_T$) in the equation have equal effects on all devices located on a common chip, as is the case in circuits of the type illustrated in U.S. Pat. No. 4,295,065 and in the present application. This means that, for the circuit shown in 4,295,065, a certain channel width must be provided in order to maintain $R_{ON}$ at acceptable levels. This requirement has a disadvantageous impact upon the density of devices on a given chip.

Another disadvantage of circuits of the type illustrated in U.S. Pat. No. 4,295,065 is that when $V_{IN}$ (refer to FIG. 2 of the present application) is low (for example, 0.8 V) and the gate of $N_3$ is connected to $V_{IN}$, the output of the inverter circuit can have an additional state. This is due to the fact that, as noted above, $N_3$ in this circuit is off or highly resistive when $V_{IN}$ is low. In order to keep the inverter formed by $P_1$ and $N_1$ from "tristating," an additional voltage source ($V_C$) and two additional devices ($P_2$ and $N_2$) are required.

An object of the present invention is to provide a TTL to CMOS input buffer circuit which allows device width to be decreased while channel resistance is held constant, permitting increased device density on a chip.

Another object of the present invention is to provide a TTL to CMOS input buffer circuit which can be implemented with a minimal number of devices, which requires a minimal number of voltage sources, and which consumes a minimal amount of power.

In the circuit of the present invention, a transistor is provided which has a gate terminal connected directly to the power supply terminal $V_{DD}$. This connection allows for a decrease in device width, while a constant channel resitance $R_{ON}$ is maintained. This decrease in device width allows for greater device density on a given chip.

The circuit of the present invention also eliminates the tristating problem discussed above. The additional components ($P_2$ and $N_2$) and power supply ($V_C$) required in prior art circuits are eliminated. Thus, the circuit can be implemented with a minimal number of components and consumes a minimal amount of power.

The circuit of the present invention comprises: a first field effect transistor of one conductivity type and a second field effect transistor of the other conductivity type, each of said first and second transistors having a main current conducting path; a third field effect transistor also having a main current conducting path; means for coupling the main current conducting path of the third transistor in series between the main current conducting paths of the first and second transistors, each of the first, second and third transistors having a control electrode, the signal level on which controls current flow through the main current conducting path thereof; means for coupling the control electrodes of the first and second transistors to the output of a TTL circuit, the output signal of which is to be converted to a CMOS logic level; means for coupling the main current conducting path of the third transistor to the buffer output; and means for coupling the control electrode of the third transistor to a voltage source having an absolute magnitude which is greater than the voltage on the control electrodes of the first and second transistors (i.e. $V_{in}$ from the TTL circuit). This source of voltage is, in the preferred embodiment discussed below, the CMOS voltage source $V_{DD}$. However, the TTL voltage source, $V_{CC}$, or an independent voltage source could also be used. It should also be noted that a single voltage source can be used for both $V_{CC}$ and $V_{DD}$. However, this is not a necessity and, in the embodiment discussed below, $V_{DD}$ is unrelated to the voltage source $V_{CC}$ of the TTL circuit, the output of which the invention buffers. In a preferred embodiment, the second and third transistors are of the same conductivity types.

Another embodiment of the circuit of the present invention further comprises a fourth transistor having a main current conducting path and a control electrode, means for coupling the main current conducting path of the fourth transistor between the terminal of the CMOS voltage supply to which the main current conducting path of the first transistor is coupled and the output terminal, and means for coupling the control electrode of the fourth transistor to the output of the TTL circuit.

In yet another preferred embodiment of the circuit of the present invention, the means for coupling the main current conducting path of the third transistor to the buffer output comprises a fifth bipolar transistor having a main current conducting path and a control electrode, means for coupling the control electrode of the fifth transistor to the source of the third transistor, and means for coupling the main current conducting path of the fifth transistor between the output of the level conversion circuit and the voltage source having an absolute magnitude which is greater than the voltage on the control electrodes of the first and second transistors. The bipolar transistor employed may be a common parasitic device produced in conjunction with the CMOS circuits. The bipolar device provides a degree of temperature compensation to the output of the circuit, due to variations in $V_{BE}$ of the device, as will be described in detail below.

Other objects, advantages and novel features of the present invention will become apparent from the following detailed description of the invention when considered in conjunction with the accompanying drawings.

DETAILED DESCRIPTION OF THE DRAWINGS

Figure 1:
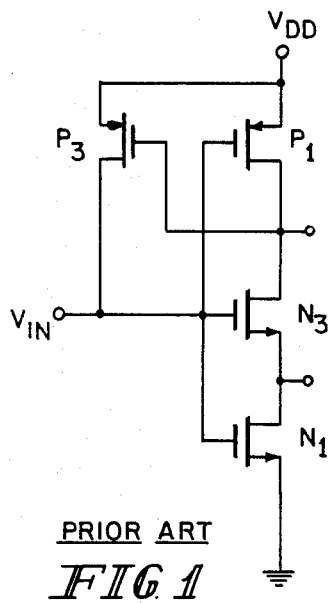
FIGS. 1-2 illustrate prior art circuits.
Figure 2:
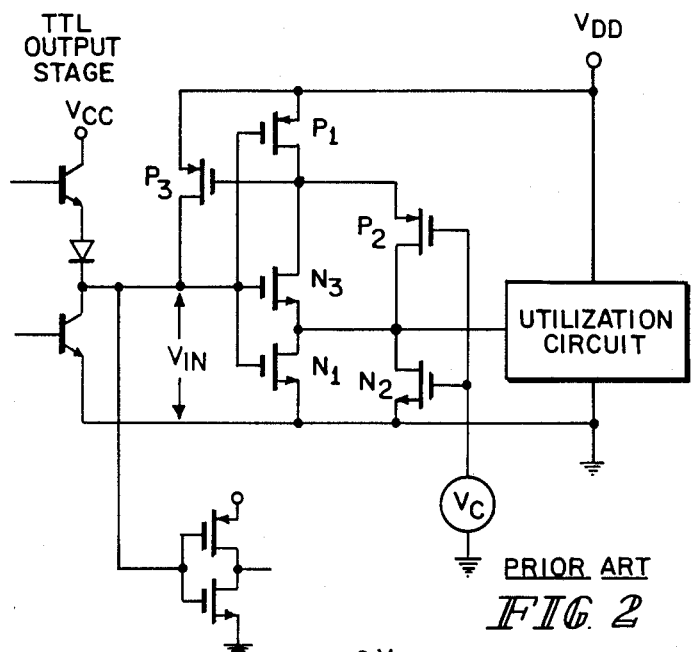

Referring to the previously known circuits of FIGS. 1-2, to obtain a given resistance in a particular CMOS device channel, the gate-to-source voltage is controlled. In these circuits, the voltage $V_{IN}$ across the gate of the device $N_3$ results in a particular channel resistance, $R_{ON}$, for given device widths. This voltage is usually about 2.4 volts when $V_{IN}$ is high. When $V_{IN}$ is low (i.e., about 0.8 V) and the gate of device $N_3$ in either of these circuits is connected to $V_{IN}$, the output can assume one of three states, because device $N_3$ is turned off or highly resistive if $V_{IN}$ is slightly less than 0.8 V. Therefore, to preclude the availability of this third state, the circuits of FIGS. 1 and 2 require another voltage source $V_C$ and additional devices, such as devices $P_2$ and $N_2$, as shown in FIG. 2 of the present application and FIG. 1 of U.S. Pat. No. 4,295,065.

Figure 3:
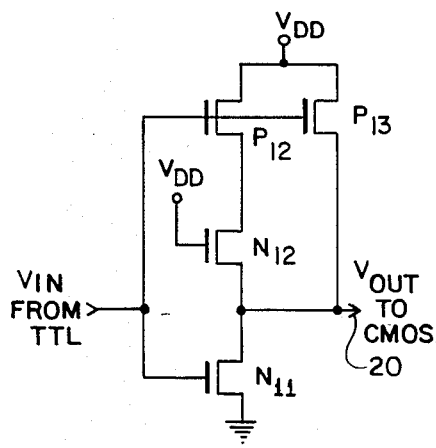
FIGS. 3-6 illustrate circuits embodying the present invention.

Turning now to FIG. 3, when $V_{IN}$ is low and the gate of a device $N_{12}$ is connected to $V_{DD}$, the device $N_{12}$ is conductive. In this case, the current from device $P_{12}$ flows through device $N_{12}$ and the voltage at output node 20 of the circuit of FIG. 3 is permitted to rise. Device $P_{13}$ allows node 20 to rise completely to $V_{DD}$ when $V_{IN}$ is below 0.8 volts. This higher voltage provides a better output drive in a TTL-to-CMOS level shift converter than is available with the prior art circuits of FIGS. 1 and 2, without the additional voltage source $V_C$ and the additional devices ($P_2$ and $N_2$ in FIG. 2) driven by that additional voltage source.

Figure 4:
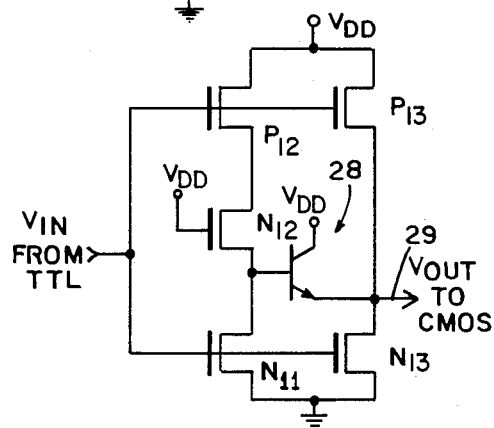

In the embodiment of FIG. 4, a bipolar device 28 is added to the inverter. This device 28 has its base coupled to, and is driven from, the output node at the source of $N_{12}$. Another n-channel device $N_{13}$ is added to drive the emitter of device 28. An NPN transistor, such as device 28, is a common parasitic device in junction-isolated CMOS circuits. The NPN transistor 28 reduces the driving requirements of CMOS device $N_{12}$, because the transistor 28 buffers any capacitance, such as gate capacitance, of a driven CMOS stage (not shown). Buffering of the gate capacitance of the driven stage by the transistor 28 reduces the rise time of the output on the source of device $P_{13}$, the emitter of transistor 28 and the drain of device $N_{13}$. Device $N_{13}$ helps to reduce the fall time of the output formed at the junction of the emitter of transistor 28, the drain of CMOS device $P_{13}$ and the drain of device $N_{13}$.

The NPN device 28 also serves to temperature compensate the output at node 29 of the input buffer. This effect is best described in U.S. Pat. No. 4,301,383 to Taylor. Briefly, the $V_{BE}$ of device 28 decreases as temperature increases. This counteracts, to some extent, the temperature-induced drift at the drain of device $N_{11}$. The following table lists the relative lengths (L) and widths (W) of the devices illustrated in FIG. 4, by device. The dimensions are in microns.

| Device No. | L | W |
|---|---|---|
| $N_{11}$ | 3 | 50 |
| $N_{12}$ | 3 | 10 |
| $N_{13}$ | 3 | 50 |
| $P_{12}$ | 3 | 100 |
| $P_{13}$ | 12 | 4 |

These gate lengths and widths describe one particular embodiment of the invention for the purpose of illustrating the circuits intended $V_{IN}/V_{OUT}$ transfer function. These lengths and widths may vary for specific transistor parameters that are the result of a manufacturer's specific I.C. fabrication process.

Figure 5:
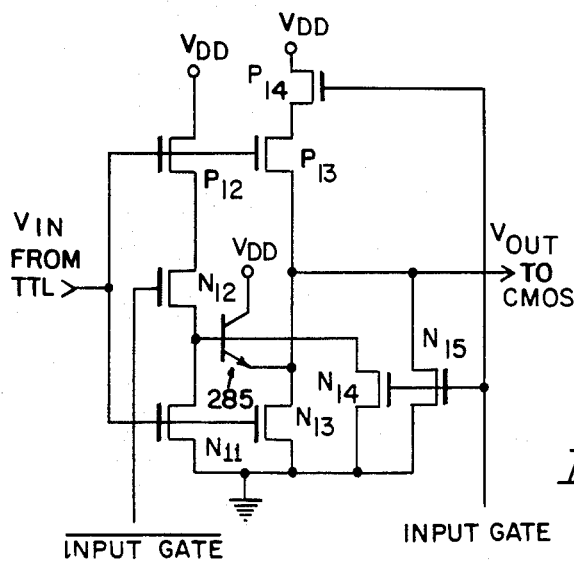
Figure 6:
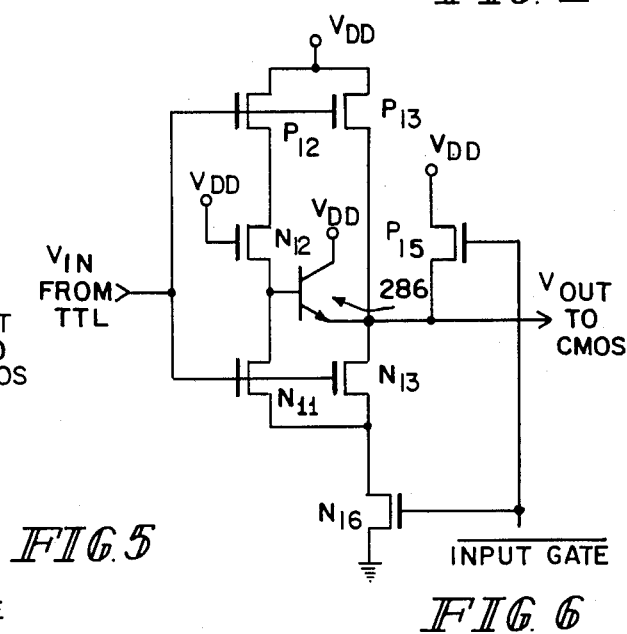

FIGS. 5 and 6 illustrate two techniques for input gating the input buffer illustrated in FIGS. 3-4. In FIG. 5, the TTL input is coupled to the gates of devices $N_{11}$, $N_{13}$, $P_{12}$, and $P_{13}$. The source of device $P_{12}$ is coupled to the $V_{DD}$ supply. Its drain is coupled to the drain of device $N_{12}$. The source of device $N_{12}$ is coupled to the drain of device $N_{11}$, the source of which is coupled to ground. $P_{12}$ and $N_{11}$ form an inverter. The gate of device $N_{12}$ is coupled to an $\overline{\text{INPUT GATE}}$ signal source which may, for example, be either $V_{DD}$ or ground. The base of a bipolar transistor 285 is coupled to the source of device $N_{12}$, as is the drain of a device $N_{14}$. The source of device $N_{14}$ is coupled to ground. The drain of device $P_{13}$ is coupled to the emitter of transistor 285, and to the drain of device $N_{13}$. The source of device $N_{13}$ is coupled to ground. The collector of transistor 285 is coupled to the $V_{DD}$ supply. The source of device $P_{13}$ is coupled to the drain of a device $P_{14}$, the source of which is coupled to the $V_{DD}$ supply. The emitter of transistor 285 forms the output terminal of the TTL-to-CMOS buffer. The drain of a device $N_{15}$ is coupled to this output terminal, and the source of device $N_{15}$ is coupled to ground. The gates of all of devices $N_{14}$, $N_{15}$ and $P_{14}$ are supplied with INPUT GATE signal. Devices $N_{14}$, $N_{15}$ and $P_{14}$ are very small devices which serve to force the output of the TTL-to-CMOS buffer low when device $N_{12}$ is non-conductive. When INPUT GATE is high and $\overline{\text{INPUT GATE}}$ is low, $N_{12}$ and $P_{14}$ are off, disconnecting $V_{DD}$, and $N_{14}$ and $N_{15}$ are on, grounding the base of the NPN transistor and the output terminal of the TTL-to-CMOS buffer, respectively. This prevents any current flow from the output of the TTL-to-CMOS buffer and effectively disables the input buffer of FIG. 5 during gating. When INPUT GATE is low and $\overline{\text{INPUT GATE}}$ is high, $N_{12}$ and $P_{14}$ are on and $N_{14}$ and $N_{15}$ are off, thus enabling the buffer.

The circuit of FIG. 6 illustrates a different type of input gating. As before, the input from the TTL circuit is coupled to the gates of CMOS device $N_{11}$, $N_{13}$, $P_{12}$ and $P_{13}$. The sources of devices $P_{12}$ and $P_{13}$ are coupled to the $V_{DD}$ supply. The drain of device $P_{12}$ is coupled to the drain of device $N_{12}$. The drain of device $P_{13}$ is coupled to the drain of device $N_{13}$. The source of device $N_{12}$ is coupled to the drain of device $N_{11}$, and the sources of devices $N_{11}$ and $N_{13}$ are joined and coupled to the drain of a device $N_{16}$, the source of which is coupled to ground. The base of a bipolar transistor 286 is coupled to the joined source of device $N_{12}$ and the drain of device $N_{11}$. The collector of transistor 286 is coupled to the $V_{DD}$ supply. The emitter of transistor 286 is coupled to the joined drain of device $P_{13}$ and drain of device $N_{13}$. This node forms the output to a subsequent CMOS circuit (not shown). The source of a device $P_{15}$ is coupled to the $V_{DD}$ supply and the drain of device $P_{15}$ is coupled to the output node. The gate of device $P_{15}$ is coupled to the gate of device $N_{16}$, and their joined gates are provided with $\overline{\text{INPUT GATE}}$ signal. In this embodiment, when the input buffer is disabled, current flow is shut off by turning $N_{16}$ off and the output is forced high by turning $P_{15}$ on with the $\overline{\text{INPUT GATE}}$ signal low.

Thus, with the circuits of FIG. 5 or 6, the output can be forced either low or high in response to gating signal in these circuits. The CMOS low power requirement is met because, when the input from the TTL circuit is at $V_{DD}$ or ground, there is no current path through the buffer from the voltage source $V_{DD}$ to ground. Furthermore, no power-consuming voltage reference $V_C$ is necessary, as is the case with prior art such as is illustrated in U.S. Pat. No. 4,295,065.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A TTL to CMOS level conversion buffer circuit including a first field effect transistor of one conductivity type and a second field effect transistor of the other conductivity type, each of said first and second transistors having a main current conducting path with a first and second end, a third field effect transistor having a main current conducting path, means for coupling the first and second ends of the main current conducting path of the third transistor in series between the first ends of the main current conducting paths of the first and second transistors, respectively, and means for coupling the second ends of the main current conducting paths of the first and second transitors to first and second terminals of a power supply, each of the first, second and third transistors including a control electrode, the signal level on which controls current flow through the main current conducting path thereof, means for coupling the control electrodes of the first and second transistors to an output of a TTL circuit, an output signal of which is to be converted to CMOS logic level, means for coupling the main current conducting path of the third transistor to an output of the buffer circuit, and means for coupling the control electrode of the third transistor to a voltage source having an absolute magnitude which is greater than the voltage on the control electrodes of the first and second transistors, and further including a fourth field effect transistor of one conductivity type and a fifth field effect transistor of the other conductivity type, each of said fourth and fifth transistors having a main current conducting path with first and second ends and a control electrode, means for coupling the first ends of the fourth and fifth transistors to each other and to the output of the buffer circuit and means for coupling the second ends of the main current conducting paths of the fourth and fifth transistors to the first and second terminals of the power supply, respectively, means for coupling the control electrodes of the fourth and fifth transistors to the output of the TTL circuit, and wherein said means for coupling the main current conducting path of the third transistor to the output of the buffer circuit comprises a bipolar transistor having a main current conducting path and a control electrode, wherein said control electrode of the bipolar transistor is coupled to the second end of the main current conducting path of the third transistor and the main current conducting path of the bipolar transistor is connected between a source of voltage and the output of the buffer circuit.

2. A circuit according to claim 1 wherein the third transistor is of the same conductivity type as the second.

3. A circuit according to claim 1 wherein the first transistor is a p-channel device and the second and third transistors are n-channel devices.

4. A circuit according to claim 1, wherein the bipolar transistor is an NPN transistor having a collector connected to the voltage source and an emitter connected to the output of the buffer circuit.

5. A circuit according to claim 1 wherein the means for coupling the second end of the main current conducting path of the fourth transistor to the terminal of the power supply comprises a sixth field effect transistor having a drain, a source, and a gate, means for coupling the drain of the sixth transistor to the source of the fourth transistor, means for coupling the source of the sixth transistor to the terminal of the power supply, and means for coupling the gate of the sixth transistor to a source of voltage signal of opposite phase to the phase of a signal provided to the control electrode of the third transistor.

6. A circuit according to claim 5 and further comprising a seventh field effect transistor having a drain, a source, and a gate, means for coupling the source of the seventh transistor to the second terminal of the power supply, means for coupling the drain of the seventh transistor to a source of the third transistor, and means for coupling the gate of the seventh transistor to a source of voltage signal of opposite phase to the phase of signal provided to the control electrode of the third transistor.

7. A circuit according to claim 6 and further comprising an eighth field effect transistor having a drain, a source, and a gate, means for coupling the source of the eighth transistor to the second terminal of the power supply, means for coupling the drain of the eighth transistor to the output of the buffer circuit, and means for coupling the gate of the eighth transistor to a source of voltage signal of opposite phase to the phase of signal provided to the control electrode of the third transistor.

8. A circuit according to claim 1 wherein the means for coupling the second and fifth transistors to the second terminal of the power supply comprises a sixth field effect transistor, means for coupling the source of the sixth transistor to the second terminal of the power supply, means for coupling the drain of the sixth transistor to the respective source terminals of the second and fifth transistors, and means for coupling the gate of the sixth transistor to a source of gating signals.

9. A circuit according to claim 8 and further comprising a seventh field effect transistor having a drain, a source, and a gate, means for coupling the drain of the seventh transistor to the output of the buffer circuit, means for coupling the gate of the seventh transistor to the source of gating signals, and means for coupling the source of the seventh transistor to the first terminal of the power supply.

* * * * *